United States Patent
Schadebrodt et al.

(10) Patent No.: US 6,844,142 B2
(45) Date of Patent: Jan. 18, 2005

(54) PRODUCTION OF FLEXOGRAPHIC PRINTING PLATES BY THERMAL DEVELOPMENT

(75) Inventors: Jens Schadebrodt, Mainz (DE); Margit Hiller, Karlstadt (DE)

(73) Assignee: BASF Drucksysteme GmbH, Stuttgart (DE)

( * ) Notice: Subject to any disclaimer, the term of this patent is extended or adjusted under 35 U.S.C. 154(b) by 0 days.

(21) Appl. No.: 10/414,468

(22) Filed: Apr. 14, 2003

(65) Prior Publication Data

US 2004/0048199 A1 Mar. 11, 2004

(30) Foreign Application Priority Data

Sep. 9, 2002 (DE) ......................................... 102 41 851

(51) Int. Cl.[7] .............................................. G03F 7/038
(52) U.S. Cl. ................ 430/306; 430/270.1; 430/281.1; 430/309; 430/945; 430/944
(58) Field of Search ......................................... 430/306

(56) References Cited

U.S. PATENT DOCUMENTS

| | | | | |
|---|---|---|---|---|
| 3,264,103 A | | 8/1966 | Cohen et al. ................... | 96/28 |
| 4,197,126 A | * | 4/1980 | Wessells et al. ............ | 430/306 |
| 5,175,072 A | | 12/1992 | Martens ....................... | 430/254 |
| 5,344,881 A | | 9/1994 | Yamamoto et al. | |
| 5,889,116 A | * | 3/1999 | Suzuki et al. ................ | 525/209 |
| 6,171,758 B1 | * | 1/2001 | Bhateja et al. ............ | 430/271.1 |

FOREIGN PATENT DOCUMENTS

| | | |
|---|---|---|
| EP | 468745 A2 | 1/1992 |
| EP | 469735 A2 | 2/1992 |
| EP | 468945 B1 | 10/1999 |
| JP | 4-67041 | 4/1992 |
| WO | 96/14603 | 5/1996 |
| WO | 01/18604A2 A3 | 3/2001 |
| WO | 01/88615 | 11/2001 |
| WO | 01/90818 | 11/2001 |
| WO | wo0188615a1 | * 11/2001 |

OTHER PUBLICATIONS

Beher, Arno "Olefins 2." first page only, from Ullmann's Encyclopedia of Indusrial Chemistry, Article online posting date Jun. 1, 2000.*

* cited by examiner

*Primary Examiner*—Cynthia Hamilton
(74) *Attorney, Agent, or Firm*—Keil & Weinkauf

(57) ABSTRACT

Flexographic printing plates are produced by thermal development by a process in which an imagewise exposed flexographic printing element is developed by heating and removing the softened, unpolymerized parts of the relief-forming layer, the flexographic printing element used comprising an olefin/(meth)acrylate copolymer having an olefin content of from 50 to 94 mol %. The photopolymerizable flexographic printing element comprises an olefin/(meth)acrylate copolymer having a content of from 50 to 94 mol % of olefin monomers, from 6 to 50 mol % of (meth)acrylate monomers and from 0 to 5 mol % of further comonomers. This flexographic printing element is used for the production of flexographic printing plates both by thermal development and by development by means of washout compositions.

14 Claims, No Drawings

PRODUCTION OF FLEXOGRAPHIC PRINTING PLATES BY THERMAL DEVELOPMENT

The present invention relates to a process for the production of flexographic printing plates by thermal development, in which an imagewise exposed flexographic printing element is developed by heating and removing the softened, unpolymerized parts of the relief-forming layer, the flexographic printing element used containing an olefin/(meth)acrylate copolymer having an olefin content of from 50 to 94 mol %. The present invention furthermore relates to a photopolymerizable flexographic printing element which contains an olefin/(meth)acrylate copolymer containing from 50 to 94 mol % of olefin monomer(s), from 6 to 50 mol % of (meth)acrylate monomer(s) and from 0 to 5 mol % of further comonomers, and the use of this flexographic printing element for the production of flexographic printing plates both by thermal development and by development by means of washout compositions.

The most widely used process for the production of flexographic printing plates comprises the imagewise exposure of the photopolymerizable relief-forming layer through a photographic or digitally prepared mask. In a further process step, the exposed layer is treated with a suitable solvent or solvent mixture, the unexposed, unpolymerized parts of the photopolymerizable layer being removed while the exposed, polymerized parts are retained and form the relief of the printing plate. However, the washout process requires a relatively long time span. Furthermore, although the polymerized layer components are not dissolved, they nevertheless swell in the washout composition. The plate must therefore also be carefully dried after washing out before it can be used for printing. The drying process can take several hours.

As an alternative to the development by means of solvents, U.S. Pat. No. 3,264,103, U.S. Pat. No. 5,175,072, WO 96/14603 or WO 01/88615 has proposed thermal development.

No solvent is used in the thermal development. Instead, after the imagewise exposure, the relief-forming layer is brought into contact with an absorbent material and is heated. The absorbent material is, for example, a porous nonwoven, for example of nylon, polyester, cellulose or inorganic materials. As a result of the heating, the unpolymerized parts of the relief-forming layer are liquefied and are absorbed by the nonwoven. The saturated nonwoven is then removed.

Instead of using absorbent materials for removing the liquefied material, WO 01/90818 has proposed, as an alternative, treating the exposed flexographic printing element with a hot air or liquid stream under superatmospheric pressure and thus removing the unpolymerized parts.

EP-A 468 745 has proposed elastomeric polyurethanes as preferred materials for flexographic printing elements for thermal development, although this publication also designates some commercially available flexographic printing elements intended for development with solvents as being suitable in principle.

WO 01/88615 confirms that commercially available flexographic printing elements intended for development with solvents are frequently not suitable for thermal development and instead proposes flexographic printing elements whose relief-forming layer has specific dynamic mechanical characteristics. Olefin/(meth)acrylate copolymers are not disclosed as possible binders.

Apparatuses suitable for carrying out thermal development have been proposed by EP-A 469 735 and WO 01/18604 and are also commercially available under the name Cyrel® Fast.

In spite of the basic suitability of the thermal development for the production of flexographic printing plates, a person skilled in the art is faced with a multiplicity of problems in implementing this concept, so that the thermal development has to date played only a minor role on the market and has by no means been able to date to replace the development by means of solvents. In particular, the production of high-resolution plates of constant quality and the production of plates having large relief heights continue to present problems.

In the thermal development, the unpolymerized material should be liquefied as thoroughly as possible in order to permit efficient and complete removal. Deposits remaining on the printing relief lead at least to reduced resolution and to a poorer-quality printed image which is not crisp. Under certain circumstances, fine relief elements are severely deformed or not formed at all.

Here, a person skilled in the art is in a typical dilemma. On the one hand, the good liquefaction of the material to be removed is of course promoted by higher temperatures. The lower the viscosity, the more readily and the more rapidly is the liquefied polymeric material absorbed by the nonwoven. The dimensional stability of the substrate film is adversely affected by increasing temperature. Distortion of the substrate film results in poorer register of the printing plate. Furthermore, in particular fine relief elements can be deformed or destroyed by excessively high temperature. Moreover, while the nonwoven is being pressed on, the printing plate is also subjected to a certain mechanical load which, in combination with the thermal load, can considerably damage the printing relief.

As a solution to this problem, WO 96/14603 has proposed for example, using films having a particularly good dimensional stability, for example those comprising PEN. However, such films are expensive and moreover have no effect on the loading of the relief elements themselves.

Furthermore, a person skilled in the art cannot use more readily softening polymers without limits for facilitating the liquefaction, since of course the elastic and the printing properties of the printing plate are also influenced by the type of polymer. In addition, very soft, plastic relief printing plates are unsuitable for flexographic printing.

Furthermore, customers frequently demand that flexographic printing elements be suitable both for thermal development and for development by means of solvents.

It is an object of the present invention to provide a process for the production of flexographic printing plates by means of thermal development and flexographic printing elements suitable for this purpose, which process does not have the above disadvantages. The thermal development should be capable of being carried out at temperatures as low as possible which should nevertheless be sufficiently rapid and give a high-quality printing relief. Furthermore, the flexographic printing element should be capable of performing a dual function, i.e. of being capable of being developed in comparable quality both thermally and by means of conventional organic washout compositions.

We have found that this object is achieved by a process for the production of flexographic printing plates by thermal development, in which the starting material used is a photopolymerizable flexographic printing element which at least comprises, arranged one on top of the other, a dimensionally stable substrate, at least one photopolymerizable, relief-forming layer, at least comprising an elastomeric binder, monomers and a photoinitiator, the process comprising at least the following steps:
(a) imagewise exposure of the photopolymerizable relief-forming layer by means of actinic radiation,
(b) heating of the exposed flexographic printing element to a temperature of from 40 to 200° C.,
(c) removal of the softened, unpolymerized parts of the relief-forming layer with formation of a printing relief,
the elastomeric binder being an olefin/(meth)acrylate copolymer having an olefin content of from 50 to 94 mol %, based on the total amount of all monomers incorporated in the form of polymerized units.

In a second aspect of the present invention, a photopolymerizable flexographic printing element was found, whose relief-forming layer comprises an olefin/(meth)acrylate copolymer having an olefin content of from 50 to 94 mol %, from 6 to 50 mol % of (meth)acrylate monomers and from 0 to 5 mol % of further comonomers, based in each case on the total amount of all monomers incorporated in the form of polymerized units.

In a third aspect of the present invention, the use of this flexographic printing element for the production of flexographic printing plates, in particular by thermal development or development with the aid of a solvent, was found.

Surprisingly, it was found that flexographic printing plates of outstanding quality are obtained by the novel process. The unpolymerized material can be removed thermally in an outstanding manner without residues remaining behind on the relief elements or relief elements being damaged. The thermal loading of the element in the course of the process is so low that good results are obtained even with the use of conventional PET films. The novel flexographic printing elements can furthermore be equally well developed thermally and by means of washout compositions.

Regarding the present invention, the following may be stated specifically:

Examples of suitable dimensionally stable substrates for the photopolymerizable flexographic printing elements used as starting material for the process are sheets, films and conical and cylindrical sleeves of metals, such as steel, aluminum, copper or nickel or of plastics, such as polyethylene terephthalate (PET), polyethylene naphthalate (PEN), polybutylene terephthalate, polyamide or polycarbonate, and, if required, also woven fabrics and nonwovens, such as glass fiber fabrics, and composite materials, for example comprising glass fibers and plastics. Particularly suitable dimensionally stable substrates are dimensionally stable substrate films, for example polyester films, in particular PET or PEN films, or flexible metallic substrates, such as thin metal sheets or metal foils of steel, preferably of stainless steel, magnetizable spring steel, aluminum, zinc, magnesium, nickel, chromium or copper.

The flexographic printing element furthermore comprises at least one photopolymerizable, relief-forming layer. Said layer can be applied directly to the substrate. However, other layers, for example adhesion-promoting layers and/or resilient lower layers, may also be present between the substrate and the relief-forming layer.

The photopolymerizable relief-forming layer comprises at least one elastomeric binder, ethylenically unsaturated monomers, a photoinitiator or a photoinitiator system and optionally further components.

The at least one elastomeric binder is an olefin/(meth)acrylate copolymer which has an olefin content of from 50 to 94 mol %, based on the total amount of all monomers incorporated in the form of polymerized units. Preferably, the olefin content is from 70 to 92, particularly preferably from 80 to 90, mol %.

The melt flow index MFI (190° C., 2.16 kg), measured according to ASTM D 1238, of the olefin/(meth)acrylate copolymer is as a rule from 0.5 to 100 g/10 min, preferably from 1 to 100 g/10 min. In particular cases, however, satisfactory results can also be obtained outside this range. The MFI (190° C., 2.16 kg) is particularly preferably from 2 to 50, very particularly preferably from 3 to 10, g/10 min.

The copolymer preferably comprises, as olefinic monomer building blocks, olefins of 2 to 8 carbon atoms, for example ethylene, propylene, 1-butene, isobutene, 1-pentene, 1-hexene, 1-heptene or 1-octene. Of course, mixtures of different olefins may also be present. Olefins of 2 to 4 carbon atoms are particularly preferred, ethylene being very particularly preferred. The particularly preferred ethylene/(meth)acrylate copolymers may be those which contain exclusively ethylene as the olefinic monomer. However, they may also be those in which ethylene forms the main component of the olefins, and other olefins, in particular said $C_2$- to $C_8$-olefins, are also incorporated in small amounts as polymerized comonomers.

Acrylic esters and/or methacrylic esters are used as comonomers for the olefins. Particularly suitable are (meth)acrylates having straight-chain or branched $C_1$- to $C_{12}$-alkyl radicals, preferably $C_1$- to $C_8$-alkyl radicals. Examples include methyl, ethyl, n-propyl, isopropyl, n-butyl, isobutyl, n-hexyl, 2-ethylhexyl, n-octyl, 2-ethyloctyl, n-decyl and n-dodecyl radicals. The alkyl radicals may also be further substituted and/or may have functional groups, provided that the properties of the relief-forming layer are not adversely affected thereby. Functional groups which have proven useful are, for example, epoxy groups. Glycidyl radicals are particularly suitable as functionalized alkyl radicals.

Preferred comonomers are methyl (meth)acrylate, ethyl (meth)acrylate, n-butyl. (meth)acrylate, ethylhexyl (meth)acrylate and glycidyl (meth)acrylate. Mixtures of a plurality of (meth)acrylates can of course also be used as comonomers. For example, a mixture of glycidyl (meth)acrylate with methyl, ethyl or butyl (meth)acrylate may be used.

The amount of (meth)acrylate comonomers is as a rule from 6 to 50, preferably from 8 to 30, particularly preferably from 10 to 20, mol %, based on the total amount of all monomers incorporated in the form of polymerized units in the copolymer.

For fine control of the properties of the copolymer used according to the invention, further comonomers having ethylenically unsaturated groups may also be present in addition to the olefins and (meth)acrylates, provided that the properties of the relief-forming layer are not adversely affected thereby. Examples of suitable comonomers include maleic anhydride, (meth)acrylic acid, maleic acid and its (mono)esters, fumaric acid and its (mono)esters, vinyllactams, vinylamides, vinyl halides, vinyl esters, vinyl ethers, vinylsilanes and vinylsiloxanes. A particularly preferred further comonomer is maleic anhydride. However, the amount of such comonomers should as a rule not exceed 5 mol %, based on the total amount of all monomers contained in the olefin/(meth)acrylate copolymer.

The ethylene/(meth)acrylate copolymers are preferably random copolymers. They are commercially available, for example, under the name Lotryl® or Lotader®. Mixtures of two or more different ethylene/(meth)acrylate copolymers can of course also be used. In addition to the at least one ethylene/(meth)acrylate copolymer, the relief-forming layer can optionally also have one or more secondary binders. Such secondary binders can be used by a person skilled in the art for the fine control of the properties of the subsequent printing plate. For example, the resilience or the ink acceptance of the printing plate can be influenced. Examples of suitable secondary binders include ethylene/propylene/diene terpolymers, ethylene/octene copolymers, ethylene/vinyl acetate copolymers, nitrile rubber, natural rubber, butyl rubber, polyisobutylene, polyisoprene, polybutadiene, polychloroprene, styrene/diene block copolymers, hydrogenated styrene/diene block copolymers, polyvinylbutyral and styrene/butadiene emulsion copolymers. The choice of secondary binders is in principle not limited, provided that the properties of the relief-forming layer are not adversely affected thereby. In particular, the type and amount of secondary binders should be chosen so that the relief-forming layer has sufficient transparency. However, the amount of secondary binders should as a rule not exceed 20, preferably 10, particularly preferably 5, % by weight, based on the total amount of all binders used.

The total amount of binders, i.e. olefin/(meth)acrylate copolymers and any secondary binders present together, is usually from 40 to 95, preferably from 50 to 85, particularly preferably from 60 to 80, % by weight, based on the sum of all components of the relief-forming layer.

The photopolymerizable relief-forming layer furthermore comprises polymerizable compounds or monomers in a known manner. The monomers should be compatible with the olefin/(meth)acrylate copolymers and should have at least one polymerizable, ethylenically unsaturated double bond. Esters or amides of acrylic acid or methacrylic acid with mono- or polyfunctional alcohols, amines, aminoalcohols or hydroxyethers and hydroxyesters, esters of fumaric or maleic acid or allyl compounds have proven particularly advantageous. Examples of suitable monomers are butyl acrylate, 2-ethylhexyl acrylate, lauryl acrylate, 1,4-butanediol diacrylate, 1,6-hexanediol diacrylate, 1,6-hexanediol dimethacrylate, 1,9-nonanediol diacrylate, trimethylolpropane tri(meth)acrylate, dioctyl fumarate and N-dodecylmaleimide. The amount of monomers in the relief-forming layer is a rule from 4.9 to 30, preferably from 4.9 to 20, % by weight, based on the amount of all components.

The photopolymerizable relief-forming layer furthermore has a photoinitiator or a photoinitiator system in a manner known in principle. Examples of suitable initiators are benzoin and benzoin derivatives, such as methylbenzoin or benzoin ethers, benzil derivatives, such as benzil ketals, acylarylphosphine oxides, acylarylphosphinic esters, polynuclear quinones and benzophenones. The amount of photoinitiator in the relief-forming layer is as a rule from 0.1 to 5% by weight, based on the amount of all components of the relief-forming layer.

The relief-forming layer can optionally comprise a plasticizer. Mixtures of different plasticizers may also be used. Examples of suitable plasticizers include modified and unmodified natural oils and natural resins, such as high-boiling paraffinic, naphthenic or aromatic mineral oils, synthetic oligomers or resins, such as oligostyrene, high-boiling esters, oligomeric styrene/butadiene copolymers, oligomeric α-methylstyrene/p-methylstyrene copolymers, liquid oligobutadienes, in particular those having a molecular weight of from 500 to 5000 g/mol, or liquid oligomeric acrylonitrile/butadiene copolymers or oligomeric ethylene/propylene/diene copolymers. Vinyl-rich polybutadiene oils, high-boiling aliphatic esters and mineral oils are preferred. High-boiling, substantially paraffinic and/or naphthenic mineral oils are particularly preferred. For example, paraffin-based solvates and special oils under the names Shell Catenex S and Shell Catenex PH are commercially available. In the case of mineral oils, a person skilled in the art distinguishes between technical white oils, which may still have a very low aromatics content and medical white oils, which are substantially free of aromatics. They are commercially available, for example under the names Shell Risella (technical white oil) and Shell Ondina (medical white oil).

Furthermore, certain synthetic plasticizers, for example peralkylated aromatics, which are free of aromatics harmful to health, are also suitable as plasticizers. Such synthetic plasticizers, frequently extended with white oils, are available, for example, under the name Kettlitz Mediaplast.

The amount of an optionally present plasticizer is determined by a person skilled in the art according to the desired properties of the layer. However, it should as a rule not exceed 40, preferably 30, % by weight, based on the sum of all components of the photopolymerizable relief-forming layer. If a plasticizer is present, amounts of from 5 to 30, preferably from 10 to 25, % by weight have proven useful.

The relief-forming layer can optionally comprise further components, for example thermal polymerization inhibitors, dyes, pigments, photochromic additives or antioxidants. As a rule, however, not more than 10, preferably not more than 5, % by weight, based on the sum of all components of the layer, should be used.

The photopolymerizable relief-forming layer may comprise a plurality of photopolymerizable layers one on top of the other, which have an identical, almost identical or different composition. A multilayer structure has the advantage that the properties of the surface of the printing plate, for example ink transfer, can be changed without influencing the typical flexographic printing properties of the printing plate, for example hardness or resilience. Surface properties and layer properties can thus be changed independently of one another in order to achieve an optimum printed copy.

The flexographic printing elements may optionally also comprise further layers in addition to the relief-forming layer.

Examples of such layers include an elastomeric lower layer comprising another formulation, which is present between the substrate and the relief-forming layer or layers. By means of such lower layers, it is possible to change the mechanical properties of the flexographic printing plates without influencing the properties of the actual printing relief layer.

Resilient substructures which are present under the dimensionally stable substrate of the flexographic printing element, i.e. on that side of the substrate which faces away from the relief-forming layer, serve the same purpose.

Further examples include adhesion-promoting layers, which bond the substrate to layers present thereon or bond different layers to one another.

The thickness of the relief-forming layer or layers is determined by a person skilled in the art according to the desired intended use of the flexographic printing plate and is as a rule from 0.5 to 7 mm, preferably from 0.5 to 5 mm, particularly preferably from 0.7 to 2.5 mm.

The photopolymerizable flexographic printing element may furthermore have a transparent, nontacky release layer. They facilitate the removal of any protective film present before the use of the flexographic printing element and thus avoid damage to the relief-forming layer. They furthermore make it easier to lay on and remove the photographic negative for imaging. Release layers are formed by a polymer forming strong films and any additives contained therein. Examples of suitable polymers forming strong films are polyamides, completely or partly hydrolyzed polyvinyl acetates and polyethylene oxide/vinyl acetate graft polymers. In general, the release layers are from 0.2 to 25, preferably from 2 to 20, µm thick.

The flexographic printing element used as a starting material can optionally also be protected from damage by a protective film, for example a PET protective film, which is present on the respective uppermost layer of the flexographic printing element, i.e. as a rule on the release layer. If the photosensitive flexographic printing element has a protective film, this must be peeled off before the novel process is carried out.

The production of the novel flexographic printing element has no peculiarities at all and can be carried out by the methods known in principle to a person skilled in the art, for example by kneading the components and forming the layer by molding, by means of extrusion and calandering between substrate film and cover sheet or by casting the dissolved components of the layer onto the dimensionally stable substrate.

The flexographic printing element just disclosed is intended for conventional imaging by means of photographic masks. In a further embodiment of the present invention, it may also be a digitally imagable flexographic printing element. Here, the flexographic printing element has an additional digitally imagable layer. This may be present on the transparent release layer but, when digitally imagable layers are present, the release layer can also be dispensed with.

The digitally imagable layer is preferably a layer selected from the group consisting of the IR-ablative layers, inkjet layers and thermographic layers.

IR-ablative layers or masks are opaque to the wavelength of actinic light and usually comprise a film-forming thermally decomposable binder and at least one IR absorber, for example carbon black. Carbon black also ensures that the layer is opaque. Suitable binders are both binders such as polyamides or nitrocellulose, which are soluble in an organic medium, and binders such as polyvinyl alcohol or polyvinyl alcohol/polyethylene glycol graft copolymers, which are soluble in an aqueous medium. In the IR-ablative layer, it is possible to write into a mask by means of an IR laser, i.e. the layer is decomposed and removed in the areas where the laser beam is incident on it. Imagewise exposure to actinic light can be effected through the resulting mask. Examples of the imaging of flexographic printing elements using IR-ablative masks are disclosed, for example, in EP-A 654 150 or EP-A 1 069 475.

In the case of inkjet layers, a transparent layer writable using inkjet inks, for example a gelatin layer, is applied. Said layer can be printed by means of inkjet printers using opaque inks. Examples are disclosed in EP-A 1 072 953.

Thermographic layers are transparent layers which contain substances which become black under the influence of heat. Such layers comprise, for example, a binder and an inorganic or organic silver salt and can be provided with an image by means of a printer having a thermal printing head. Examples are disclosed in EP-A 1 070 989.

The digitally imagable layer may also be a peel-off layer, as disclosed, for example, in EP-A 654 151.

In a preferred embodiment, the digitally imagable layers are soluble in water or predominantly aqueous solvent mixtures.

The digitally imagable layers can be cast onto the photopolymerizable layer or the release layer in a manner known in principle.

For carrying out the novel process, the flexographic printing element is used as a starting material. If the flexographic printing element comprises a protective film, this is first peeled off. In the first process steps, the flexographic printing element is exposed imagewise and then thermally developed in further process steps.

In process step (a), the photopolymerizable relief-forming layer is first exposed imagewise by means of actinic radiation. The imagewise exposure can be effected by means of the methods known in principle.

In the conventional method, a photographic mask is placed on top for imaging the relief-forming layer in process step (a). The flexographic printing element is then exposed to actinic light through the mask placed on top.

Suitable actinic, i.e. chemically effective, light is known to be, in particular, UVA or UV/VIS radiation. As a result of the irradiation, the photopolymerizable layer is crosslinked in the parts which are not covered. To ensure that the photographic negative is placed on top in a trouble-free manner, the exposure can be carried out in a known manner using a vacuum printing frame or under a glass plate.

If the dimensionally stable substrate is transparent, the flexographic printing element can optionally be exposed to actinic light from the back in a process step upstream of (a). By means of such a step, the relief height can be determined, and said step helps to achieve better adhesion of the relief elements.

In process steps (b) and (c) of the novel process, the imagewise exposed flexographic printing element is thermally developed. The two process steps can be carried out in succession or simultaneously.

In process step (b), the flexographic printing element is heated so that the unpolymerized parts of the relief-forming layer soften, liquefy or melt. A person skilled in the art is aware that the term melt with regard to the material comprising polymer, monomer, photoinitiator and, if required, plasticizer and other additives cannot be defined as precisely as in the case of pure, low molecular weight substances. What is meant here is that the viscosity of the material is to be reduced to such an extent that it can be absorbed by a nonwoven or removed in another manner in process step (c).

The flexographic printing element is heated in step (b) to a temperature which is sufficiently high to liquefy the unpolymerized layer parts to a sufficient extent, but without damaging the polymerized parts of the layer. In general, a temperature of from 40 to 200° C. is required for this purpose. The flexographic printing element is preferably heated to a temperature of from 60 to 160° C.

The heating can be effected, for example, by exposure to a heat source, for example by means of an IR lamp. Further examples include immersion in hot baths, heating by means of hot air or liquid streams or bringing the flexographic printing element into contact with hot surfaces, without it being intended to restrict the invention thereto. A combination of a plurality of methods may also be used. Preferably, the flexographic printing element is heated from the front. Thus, the surface of the relief-forming layer usually has a higher temperature than the parts of the layer which are located below the surface.

In step (c), the softened, unpolymerized parts of the relief-forming layer are removed. The polymerized parts remain behind on the substrate, forming the printing relief.

Step (c) can be carried out, for example, by bringing the heated relief-forming layer into contact with an absorbent material. The heated, liquefied, unpolymerized parts of the relief-forming layer are thus absorbed by the absorbent material. In order to achieve very efficient absorption, very intimate contact between the absorbent material and the surface of the flexographic printing element should be established. For example, the absorbent material can be placed on the surface and then pressed down. After saturation of the absorbent material with the polymeric material, the absorbent material is removed from the still warm flexographic printing plate. To ensure as complete removal as possible of the softened material, it is usually advisable to repeat this process with fresh absorbent material until all liquefied material has been removed. Suitable absorbent materials are suitable porous materials, for example nonwovens of nylon, polyester or cellulose. Further details on the procedure of step (d) are disclosed in WO 01/88615, page 15, line 6, to page 17, line 2, which is hereby expressly incorporated here by reference.

In an alternative embodiment for process step (b), the removal is effected by processing the heated flexographic printing element using a hot air or liquid stream under superatmospheric pressure. For example, a jet of steam under superatmospheric pressure can be directed at the top of the flexographic printing element. The hot steam stream ensures, on the one hand, heating of the flexographic printing element and softening of the unpolymerized parts of the relief-forming layer. The mechanical energy of the jet ensures separation of the liquefied material from the polymerized parts. Further details are disclosed in WO 01/90818 page 3, lines 5 to 16.

The printing plate obtained by thermal development can optionally also be aftertreated. It can, for example, be postexposed uniformly to actinic light. It can furthermore be rendered nontacky on the surface by means of $Br_2$ solution or by means of exposure to UV-C light, in a manner known in principle.

The novel process with the use of flexographic printing elements having digitally imagable layers is very similar to that described above. Instead of using a photographic mask, in process step (a), the digitally imagable layer is imaged by means of the technique required in each case and a mask is thus produced more or less in situ on the relief-forming layer.

With the use of IR-ablative masks, the IR-ablative layer is removed imagewise with the aid of an IR laser. Those parts which are subsequently to be crosslinked and form the relief elements are bared. With the use of inkjet layers or thermographic layers, the digitally imagable layer is printed by means of inkjet or thermographic printers in those parts which are not to be crosslinked in the course of the irradiation.

After production of a mask from the digitally imagable layer, exposure to actinic light is effected as with the use of a photographic mask. A vacuum printing frame for exposure is not necessary. Exposure is preferably effected by means of a flat-bed exposure unit in air.

The exposed flexographic printing elements can be used as such, i.e. including the digitally imagable layer or the residues thereof, for the thermal development.

In a preferred embodiment, the digitally imagable layer is removed in a process step upstream of process step (b). The prior removal of the digitally imagable layer saves time during the thermal development and prevents contamination of the thermal processing apparatus with components of the mask layer. The digitally imagable layer can be removed, for example, by peeling off or by detaching by means of a suitable solvent. In a particularly preferred embodiment, a water-soluble or at least water-swellable digitally imagable layer is used. After imaging and exposure to actinic light, the digitally imagable layer or the residues thereof can be detached by means of water or predominantly aqueous solvents. The detachment can optionally be supported by gentle mechanical treatment, for example by brushing. Since the olefin/(meth)acrylate binders used according to the invention are as a rule soluble only in organic solvents or solvent mixtures, the unpolymerized parts of the relief-forming layer are not dissolved, nor are the polymerized parts swollen. The flexographic printing element pretreated in this manner can therefore be further processed directly thereafter without drying being necessary.

The novel flexographic printing elements are equally suitable both for thermal development and for conventional development by means of washout compositions. In the conventional development, after the imagewise exposure of the flexographic printing element, the exposed flexographic printing element is developed in a known manner using an organic solvent or solvent mixture.

The novel flexographic printing elements can furthermore be used as starting materials for the production of flexographic printing plates by means of direct laser engraving. A flexographic printing element which has no digitally imagable layer is used for this purpose. This is crosslinked uniformly by means of actinic light, i.e. without placing a mask on top, in a first process step. The printing relief can then be engraved directly into the uniformly crosslinked relief-forming layer by means of a $CO_2$ laser. The crosslinked layer is thermally decomposed in the parts where the laser is incident on it. Further details of the direct laser engraving technique for the production of flexographic printing plates are disclosed, for example, in EP-A 1 136 254 and U.S. Pat. No. 5,259,311.

The novel flexographic printing elements have a number of advantages over conventional flexographic printing elements. They have a particularly good ozone tear resistance, low swelling even in UV inks, high resilience, low plastic deformation, constantly good adhesion to the substrate even during long print runs and particularly high transparency of the relief-forming layer. Furthermore, they can be produced particularly economically by means of extrusion at relatively low temperatures.

The examples which follow illustrate the invention.
The following materials were used for the examples:
A) Binder
Lotader AX8900: Random ethylene/methyl acrylate/ glycidyl methacrylate copolymer (25% by weight of methyl acrylate, 8% by weight of glycidyl methacrylate, MFI=6 g/10 min according to ASTM D 1238, melting point 65° C., from ATOFINA)
Lotryl, 35MA05: Random ethylene/methyl acrylate copolymer (35% by weight of methyl acrylate, MFI=4.5–5.5 g/10 min according to ASTM D 1238, melting point 50° C., from ATOFINA)
Lotryl 29MA03: Random ethylene/methyl acrylate copolymer (29% by weight of methyl acrylate, MFI=2–3.5 g/10 min according to ASTM D 1238, melting point 61° C., from ATOFINA)
Lotryl 28MA07: Random ethylene/methyl acrylate copolymer (28% by weight of methyl acrylate, MFI=6–8 g/10 min according to ASTM D 1238, melting point 65° C., from ATOFINA)
Lotryl 35BA40: Random ethylene/butyl acrylate copolymer (35% by weight of butyl acrylate, MFI=35–40 g/10 min according to ASTM D 1238, melting point 67° C., from ATOFINA)
Lotryl 24MA07: Random ethylene/methyl acrylate copolymer (24% by weight of methyl acrylate, MFI=6–8 g/10 min according to ASTM D 1238, melting point 73° C., from ATOFINA)
Lotryl 30BA02: Random ethylene/butyl acrylate copolymer (30% by weight of butyl acrylate, MFI=1.5–2.5 g/10 min according to ASTM D 1238, melting point 78° C., from ATOFINA)

Lotryl 20MA08: Random ethylene/methyl acrylate copolymer (20% by weight of methyl acrylate, MFI=7–9 g/10 min according to ASTM D 1238, melting point 80° C., from ATOFINA)

Lotryl 17BA07: Random ethylene/butyl acrylate copolymer (17% by weight of butyl acrylate, MFI=6.5–8 g/10 min according to ASTM D 1238, melting point 91° C., from ATOFINA)

Kraton D-1161: Styrene/isoprene/styrene block copolymer (15% by weight of styrene units, two-block fraction=17%, from KRATON)

Kraton D-1102: Styrene/butadiene/styrene block copolymer (30% by weight of styrene units, two-block fraction=17%, from KRATON)

B) Further Components of the Relief-Forming Layer

Ondina 934: Paraffinic mineral oil plasticizer (from SHELL)

Hallstar BST: Butyl stearate (from C. P. HALL)

Nisso PB-B 1000: Polybutadiene oil having an average molecular weight of about 1 050 g/mol (from NIPPON-SODA)

Laromer HDDA: 1,6-Hexanediol diacrylate (from BASF)

1,6-HDDMA: 1,6-Hexanediol dimethacrylate (from DEGUSSA/ROEHM)

Lauryl acrylate 1214: Mixture of n-dodecyl acrylate and n-tetradecyl acrylate (from BASF)

Lucirin BDK Benzil dimethyl ketal (from BASF)

Benzophenone 99% benzophenone (from ALDRICH)

Kerobit TBK 2,6-di-tert-Butyl-p-cresol (from RASCHIG)

Toluene Toluene (from BASF)

EXAMPLE 1

Production of a photopolymerizable flexographic printing element of novel composition comprising an ethylene/methyl acrylate/glycidyl methacrylate copolymer (ethylene content=87.3 mol %, melting point (measured by means of DSC)=65° C.) as a binder.

33.23 g (66.46% by weight) of Lotader AX8900 are preplasticated in a 50 ml laboratory measuring kneader at an initial temperature of 140° C. for about 2 minutes. A solution of 1.0 g (2.00% by weight) of lauryl acrylate 1214, 4.0 g (8.00% by weight) of Laromer HDDA, 1.0 g (2.00% by weight) of Lucirin BDK, 0.25 g (0.50% by weight) of benzophenone, 0.5 g (1.00% by weight) of Kerobit TBK and 20 mg (0.04% by weight) of a red dye is then added. As soon as a homogeneous melt has formed again, 10.0 g (20.00% by weight) of Ondina 934 are also added. After a few minutes, the melt has become homogeneous again.

The elastomeric mixture obtained is divided into relatively small pieces. A 1.27 mm thick flexographic printing element is produced by pressing between a 5 μm thick PET protective film with a polyamide substrate and a PET substrate film coated with a mixture of adhesive-forming components, at 140° C. and 200 bar, in a commercial rubber press. The cold flexographic printing element is homogeneous and flexible. By repeating the process described, further examples of the flexographic printing element are produced. Before the further processing, the flexographic printing elements are stored for 3 days.

EXAMPLE 2

Production of a flexographic printing plate of novel composition comprising an ethylene/methyl acrylate/glycidyl methacrylate copolymer (ethylene content=87.3 mol %, melting point=65° C.) as a binder.

Analogously to example 1, a flexographic printing element is produced by kneading the starting components and pressing the kneaded material between two PET films. The amount and type of the components used are shown in table 1. The flexographic printing element obtained is homogeneous and flexible.

EXAMPLE 3

Production of a flexographic printing plate of novel composition comprising an ethylene/methyl acrylate/glycidyl methacrylate copolymer (ethylene content=87.3 mol %, melting point=65° C.) as a binder.

Analogously to example 1, a flexographic printing element is produced by kneading the starting components and pressing the kneaded material between two PET films. The amount and type of the components used are shown in table 1. The flexographic printing element obtained is homogeneous and flexible.

EXAMPLE 4

Production of a flexographic printing plate of novel composition comprising an ethylene/methyl acrylate copolymer (ethylene content=85.1 mol %, melting point=50° C.) as a binder.

Analogously to example 1, a flexographic printing element is produced by kneading the starting components and pressing the kneaded material between two PET films. The amount and type of the components used are shown in table 1. The flexographic printing element obtained is homogeneous and flexible.

EXAMPLE 5

Production of a rigid flexographic printing plate of novel composition comprising an ethylene/methyl acrylate copolymer (ethylene content=88.3 mol %, melting point=61° C.) as a binder.

Analogously to example 1, a flexographic printing element is produced by kneading the starting components and pressing the kneaded material between two PET films. The amount and type of the components used are shown in table 1. The flexographic printing element obtained is homogeneous and flexible.

EXAMPLE 6

Production of a rigid flexographic printing plate of novel composition comprising an ethylene/methyl acrylate copolymer (ethylene content=88.8 mol %, melting point=65° C.) as a binder. Analogously to example 1, a flexographic printing element is produced by kneading the starting components and pressing the kneaded material between two PET films. The amount and type of the components used are shown in table 1. The flexographic printing element obtained is homogeneous and flexible.

EXAMPLE 7

Production of a flexographic printing plate of novel composition comprising an ethylene/butyl acrylate copolymer (ethylene content=89.5 mol %, melting point=67° C.) as a binder.

Analogously to example 1, a flexographic printing element is produced by kneading the starting components and pressing the kneaded material between two PET films. The amount and type of the components used are shown in table 1. The flexographic printing element obtained is homogeneous and flexible.

EXAMPLE 8

Production of a rigid flexographic printing plate of novel composition comprising an ethylene/methyl acrylate copolymer (ethylene content=90.7 mol %, melting point= 73° C.) as a binder.

Analogously to example 1, a flexographic printing element is produced by kneading the starting components and pressing the kneaded material between two PET films. The amount and type of the components used are shown in table 1. The flexographic printing element obtained is homogeneous and flexible.

EXAMPLE 9

Production of a rigid flexographic printing plate of novel composition comprising an ethylene/butyl acrylate copolymer (ethylene content=91.4 mol %, melting point=78° C.) as a binder.

Analogously to example 1, a flexographic printing element is produced by kneading the starting components and pressing the kneaded material between two PET films. The amount and type of the components used are shown in table 1. The flexographic printing element obtained is homogeneous and flexible.

EXAMPLE 10

Production of a flexographic printing plate of novel composition comprising an ethylene/methyl acrylate copolymer (ethylene content=92.5 mol %, melting point= 80° C.) as a binder.

Analogously to example 1, a flexographic printing element is produced by kneading the starting components and pressing the kneaded material between two PET films. The amount and type of the components used are shown in table 1. The flexographic printing element obtained is relatively rigid and not very resilient. The amount and type of the components used are shown in table 1.

COMPARATIVE EXAMPLE A

Production of a flexographic printing plate having a composition not according to the invention and comprising an ethylene/butyl acrylate copolymer (ethylene content= 95.7 mol %; melting point=89° C.) as a binder.

Analogously to example 1, a flexographic printing element is produced by kneading the starting components and pressing the kneaded material between two PET films. The amount and type of the components used are shown in table 1. After cooling, an oily film caused by exudation of incompatible formulation components forms on the surface of the kneaded material. Further processing of the kneaded material to give a flexographic printing element is no longer possible. In addition, the kneaded material is very hard and not very resilient after cooling.

COMPARATIVE EXAMPLE B

Production of a flexographic printing plate having a composition not according to the invention and comprising an SIS block copolymer (styrene content=15% by weight, two-block fraction=17%) as a binder.

Analogously to example 1, a flexographic printing element is produced by kneading the starting components and pressing the kneaded material between two PET films. The amount and type of the components used are shown in table 1.

COMPARATIVE EXAMPLE C

Production of a flexographic printing plate having a composition not according to the invention and comprising an SBS-block copolymer (styrene content=30% by weight, two-block fraction=17%) as a binder.

Analogously to example 1, a flexographic printing element is produced by kneading the starting components and pressing the kneaded material between two PET films. The amount and type of the components used are shown in table 1.

TABLE 1

| | | Amount of the components used | | | | | | | | |
|---|---|---|---|---|---|---|---|---|---|---|
| | | Monomers | | | Photoinitiator and antioxidant | | Plasticizer | | | Additives |
| Ex. No. | Binder [% by wt.] | Lauryl acrylate 1214 [% by wt.] | Laromer HDDA [% by wt.] | 1,6-HDDMA [% by wt.] | Lucirin BDK [% by wt.] | Kerobit TBK [% by wt.] | Ondina 934 [% by wt.] | Nisso PB-B 1000 [% by wt.] | Hallstar BST [% by wt.] | Dye, UVC initiators [% by wt.] |
| | | Binder = Lotader AX8900 | | | Ethylene content: 87.3 mol % | | | | | |
| 1 | 66.46 | 2.00 | 8.00 | — | 2.00 | 1.00 | 20.00 | — | — | 0.54 |
| 2 | 66.46 | 2.00 | 8.00 | — | 2.00 | 1.00 | — | 20.00 | — | 0.54 |
| 3 | 62.46 | 2.00 | 8.00 | — | 2.00 | 1.00 | — | — | 24.00 | 0.54 |
| | | Binder = Lotryl 35MA05 | | | Ethylene content: 85.1 mol % | | | | | |
| 4 | 73.45 | — | 6.00 | 2.00 | 2.00 | 1.00 | 15.00 | — | — | 0.54 |
| | | Binder = Lotryl 29MA03 | | | Ethylene content: 88.3 mol % | | | | | |
| 5 | 73.46 | — | 6.00 | 2.00 | 2.00 | 1.00 | 15.00 | — | — | 0.54 |
| | | Binder = Lotryl 28MA07 | | | Ethylene content: 88.8 mol % | | | | | |
| 6 | 73.46 | — | 6.00 | 2.00 | 2.00 | 1.00 | 15.00 | — | — | 0.54 |
| | | Binder = Lotryl 35BA40 | | | Ethylene content: 89.5 mol % | | | | | |
| 7 | 73.45 | — | 6.00 | 2.00 | 2.00 | 1.00 | 15.00 | — | — | 0.54 |
| | | Binder = Lotryl 24MA07 | | | Ethylene content: 90.7 mol % | | | | | |

TABLE 1-continued

| | | Amount of the components used | | | | | | | | |
|---|---|---|---|---|---|---|---|---|---|---|
| | | Monomers | | | Photoinitiator and antioxidant | | Plasticizer | | | Additives |
| | | Lauryl acrylate 1214 | Laromer HDDA | 1,6-HDDMA | Lucirin BDK | Kerobit TBK | Ondina 934 | Nisso PB-B 1000 | Hallstar BST | Dye, UVC initiators |
| Ex. No. | Binder [% by wt.] | [% by wt.] | [% by wt.] | [% by wt.] | [% by wt.] | [% by wt.] | [% by wt.] | [% by wt.] | [% by wt.] | [% by wt.] |
| 8 | 73.46 | — | 6.00 | 2.00 | 2.00 | 1.00 | 15.00 | — | — | 0.54 |
| | | | Binder = Lotryl 30BA02 | | | Ethylene content: 91.4 mol % | | | | |
| 9 | 73.46 | — | 6.00 | 2.00 | 2.00 | 1.00 | 15.00 | — | — | 0.54 |
| | | | Binder = Lotryl 20MA08 | | | Ethylene content: 92.5 mol % | | | | |
| 10 | 73.46 | — | 6.00 | 2.00 | 2.00 | 1.00 | 15.00 | — | — | 0.54 |
| | | | Binder = Lotryl 17BA07 (Comparative example) | | | Ethylene content: 95.7 mol % | | | | |
| A | 73.46 | — | 6.00 | 2.00 | 2.00 | 1.00 | 15.00 | — | — | 0.54 |
| | | | Binder = Kraton D-1161 (Comparative example) | | | SIS block copolymer | | | | |
| B | 73.46 | — | 6.00 | 2.00 | 2.00 | 1.00 | 15.00 | — | — | 0.54 |
| | | | Binder = Kraton D-1102 (Comparative example) | | | SBS block copolymer | | | | |
| C | 73.46 | — | 6.00 | 2.00 | 2.00 | 1.00 | 15.00 | — | — | 0.54 |

Production of flexographic printing plates by thermal development by means of the novel process.

A commercial exposure unit or flexographic printing plates (nyloflex® F III exposure unit, BASF Drucksysteme GmbH) is used for exposing the flexographic printing elements.

First, the back of the flexographic printing plates is exposed uniformly to UV/A light without reduced pressure for 15 seconds. Thereafter, the transparent PET protective film is removed and a test negative is placed on the front of the flexographic printing plate. Exposure is effected through a test negative for various main exposure times from 6 to 20 minutes in steps of 2 minutes under reduced pressure. For this purpose, a vacuum film is drawn over negative and flexographic printing plate and a vacuum pump connected to the exposure unit is activated. The reduced pressure is about 800 mbar).

After the exposure, the printing plate is thermally processed with the aid of an experimental apparatus. For this purpose, pieces of the exposed printing plate which have maximum dimensions of 15 cm×15 cm are fixed to a motor-driven metal roll having a diameter of 20 cm with the use of double-sided adhesive tape. A commercial polyamide nonwoven is passed over a heatable metal roll having a diameter of 5 cm. An infrared lamp for relatively rapid heating of the printing plate is fastened above the roll carrying the printing plate. After the infrared lamp has been switched on and the heatable metal roll heated to 150° C., the metal roll carrying the printing plate is caused to rotate slowly (about 2 rpm) by means of the motor. The nonwoven is conveyed past over the heatable roll under a defined contact pressure of about 2.5 bar. One complete revolution of the roll carrying the printing plate is defined as one cycle. Altogether, different numbers of cycles are carried out for processing the printing plate, the number being stated in the evaluation under the parameter Cycles.

Finally, the printing plate is released from the double-sided adhesive tape, postexposed uniformly for 10 minutes to UV/A light without reduced pressure and rendered nontacky by exposure for 20 minutes in a UV/C exposure unit.

The reproduction quality of the thermally processed flexographic printing elements is assessed by means of the same subject elements as in the method for the conventional processing. Here, the exposure time in which all positive elements are formed without errors is stated for the positive elements (LEL=lower exposure limit).

Background (=uniformity and cleanness of the relief background)

Edge crispness (=crispness of edges of the elements, freedom from melt residues)

Table 2 lists the corresponding features determined for examples 1, 3, 6 and 8 and for comparative examples C and D.

TABLE 2

| | | | | | | | | | |
|---|---|---|---|---|---|---|---|---|---|
| | Results of the thermal development | | | | | | | | |
| Example No. | Cycles [ ] | PT* [ ] | Hardness[#] [°Sh A] | Relief height [μm] | LEL [min] | Negative dot [min] | Negative line [min] | Background | Edge crispness |
| Binder = Ethylene/Methyl acrylate/Glycidyl methacrylate copolymer (Lotader AX8900) | | | | | | | | | |
| 1 | 6 | 175 | 65 | 740 | 16 | >20 | >20 | good | very good |
| 3 | 6 | 240 | 56 | 840 | 16 | >20 | >20 | very good | very good |

TABLE 2-continued

Results of the thermal development

| Example No. | Cycles [ ] | PT* [ ] | Hardness# [°Sh A] | Relief height [μm] | LEL [min] | Negative dot [min] | Negative line [min] | Background | Edge crispness |
|---|---|---|---|---|---|---|---|---|---|
| Binder = Ethylene/Methyl acrylate copolymer (Lotryl 28MA07) | | | | | | | | | |
| 6 | 6 | 118 | 70 | 780 | 14 | >20 | >20 | very good | very good |
| Binder = Ethylene/Methyl acrylate copolymer (Lotryl 24MA07) | | | | | | | | | |
| 8 | 6 | 213 | 74 | 805 | 12 | 20 | >20 | very good | very good |
| Binder = SIS block copolymer (Kraton D-116) (Comparative example) | | | | | | | | | |
| B | 10 | 180 | 60 | 460 | 14 | 16 | 14 | good | moderate |
| Binder = SBS block copolymer (Kraton D-1102) (Comparative example) | | | | | | | | | |
| C | 10 | 205 | 82 | 630 | >20 | 18 | 10 | poor | moderate |

*Pendulum tack, measured similarly to DIN 53157 using a modified pendulum
Hardness measured on the completely processed printing plate Table 2 clearly shows that flexographic printing elements of novel composition can be thermally processed in an excellent manner since, with a reduced number of cycles or reduced duration of the thermal processing, well formed positive elements can be reproduced in conventional exposure times.

Furthermore, in the case of flexographic printing elements of novel composition, negative elements, measured for comparative examples C and D, for up to substantially longer exposure times are sufficiently deep to enable subjects which contain such elements also to be printed without the danger of losses of quality. On visual assessment, too, the flexographic printing plates produced by means of thermal processing and of novel composition appear to have very crisp edges and to be uniform which guarantees a constantly high print quality even during relatively long print runs.

Production of flexographic printing plates (conventional processing by means of a washout composition).

The flexographic printing elements are exposed imagewise as described for the thermal development.

After exposure, the printing plate is washed out in a commercial continuous washer for flexographic printing plates (type Variomat VF2, from BASF Drucksysteme GmbH) using the washout composition (nylosolv II, from BASF Drucksysteme GmbH). The washout rate is set at 200 mm/min and the brush feed setting is 0 mm in all cases.

Thereafter, the plate is dried for 2 hours at 65° C. in a through-circulation drying oven, postexposed uniformly to UV-A light for 10 minutes without reduced pressure and rendered nontacky by exposure for 20 minutes in a UV/C exposure unit.

For assessing the reproduction quality achievable with the novel flexographic printing elements, the test negative contains various fine subject elements which can be optically detected or measured and evaluated. Specifically, these are the following elements, which are shown together with the parameters used for the quality assessment:

TABLE 3

Explanation of the measured values in table 4

| Element name | Element dimension | Parameter determined | Unit |
|---|---|---|---|
| Relief height | Solid area ⇆ background | Height of the printing relief | μm |
| Positive dot | Diameter 200 μm | Exposure time to complete formation | min |
| Positive line | Line width 100 μm | Exposure time to complete formation | min |
| Grid | Width of the grid lines 55 μm | Exposure time to complete formation | min |
| 2% screen | 2% dot area with 60 l/cm | Exposure time to complete formation | min |
| Negative dot | Diameter 400 μm | Exposure time with the height still > 70 μm | min |
| Negative line | Line width 2000 μm | Exposure time with the height still > 500 μm | min |

TABLE 4

Results of the development by means of washout compositions

| Example Nr. | Washout rate [mm/min] | PT* [ ] | Hardness# [°Sh A] | Relief height [μm] | Positive dot [min] | Positive line [min] | Grid [min] | Screen 2% [min] | Negative dot [min] | Negative line [min] |
|---|---|---|---|---|---|---|---|---|---|---|
| Binder = Lotader AX8900    MFI ≈ 6 g/10 min Ethylene content = 87.3 mol % | | | | | | | | | | |

TABLE 4-continued

Results of the development by means of washout compositions

| Example Nr. | Washout rate [mm/min] | PT* [ ] | Hardness# [°Sh A] | Relief height [μm] | Positive dot [min] | Positive line [min] | Grid [min] | Screen 2% [min] | Negative dot [min] | Negative line [min] |
|---|---|---|---|---|---|---|---|---|---|---|
| 1 | 160 | 57 | 63 | 780 | 8 | 8 | 12 | 8 | >20 | >20 |
| 2 | 160 | 18 | 74 | 810 | 8 | 8 | 8 | 8 | >20 | >20 |
| 3 | 140 | 83 | 65 | 920 | 10 | 12 | 20 | 12 | >16 | >20 |
| | | Binder = Lotryl 35MA05 | | MFI ≈ 5 g/10 min Ethylene content = 85.1 mol % | | | | | | |
| 4 | 140 | 52 | 59 | 940 | 12 | 12 | 12 | 12 | 16 | >20 |
| | | Binder = Lotryl 29MA03 | | MFI ≈ 3 g/10 min Ethylene content = 88.3 mol % | | | | | | |
| 5 | 120 | 69 | 70 | 780 | 18 | 16 | 16 | 16 | 18 | >20 |
| | | Binder = Lotryl 28MA07 | | MFI ≈ 7 g/10 min Ethylene content = 88.8 mol % | | | | | | |
| 6 | 140 | 49 | 68 | 930 | 16 | 16 | 16 | 16 | 20 | >20 |
| | | Binder = Lotryl 35BA40 | | MFI ≈ 40 g/10 min Ethylene content = 89.5 mol % | | | | | | |
| 7 | 140 | 34 | 65 | 950 | 8 | 8 | 10 | 12 | >20 | >20 |
| | | Binder = Lotryl 24MA07 | | MFI ≈ 7 g/10 min Ethylene content = 90.7 mol % | | | | | | |
| 8 | 70 | 105 | 74 | 1050 | 16 | 16 | 16 | 12 | 18 | 20 |
| | | Binder = Lotryl 30BA02 | | MFI ≈ 2 g/10 min Ethylene content = 91.4 mol % | | | | | | |
| 9 | 50 | 95 | 76 | 40 | n.d. | n.d. | n.d. | n.d. | n.d. | n.d. |
| | | Binder = Lotryl 20MA08 | | MFI ≈ 8 g/10 min Ethylene content = 92.5 mol % | | | | | | |
| 10 | 50 | 108 | 82 | 10 | n.d. | n.d. | n.d. | n.d. | n.d. | n.d. |
| | | Binder = Lotryl 17BA07 (Comparative example) Ethylene content = 95.7 mol % | | | | | | | | |
| A | | | | - - - Plate production not possible - - - Binder = Kraton D-1161 (Comparative example) | | | | | | |
| B | 180 | 230 | 59 | 850 | 10 | >20 | >20 | 12 | 12 | >20 |
| | | Binder = Kraton D-1102 (Comparative example) | | | | | | | | |
| C | 180 | 250 | 79 | 960 | 8 | >20 | >20 | 10 | 14 | >20 |

*Pendulum tack, measured similarly to DIN 53157 using a modified pendulum
Hardness measured on the completely processed printing plate,
n.d. not determined Table 4 shows that the flexographic printing elements of novel compositions can be readily processed conventionally, i.e. by means of a solvent-based washout process and subsequent drying, and printing plates of high quality are obtained. In particular, negative elements have a height of above-average magnitude even in the case of relatively long exposure times which has an advantageous effect on the print quality.

The production of a flexographic printing element of novel composition is possible only if the ethylene content of the binders is not greater than 94 mol %. Otherwise, components usually used in flexographic printing plates, such as monomers and plasticizers, are not compatible with the binder.

With decreasing ethylene content, the solubility of the raw layer in conventional flexographic printing washout compositions increases. In the case of binders having an ethylene content of from 92 to 94 mol %, conventional processing is possible but relatively slow. Such flexographic printing elements are still relatively hard and not optimally flexible.

Optimum properties of the novel flexographic printing elements are obtained with ethylene contents below 92 mol %. These flexographic printing elements can be readily washed out, and the finished printing plates are soft and flexible. The ink transfer of such flexographic printing plates with water-based, alcohol-based and UV-curable printing inks is excellent without there being any defects in the print in the course of the printing process.

Printing Tests

Three flexographic printing elements having a composition according to example 1 are produced by extrusion in a twin-screw extruder and calandering between substrate film and cover sheet, exposed with a test subject, developed at a washout rate of 160 mm/min in a flexographic washer operated with nylosolv II and dried for 2 hours at 65° C. Following the aftertreatment (postexposure to UV/A light for 10 minutes and elimination of tack by means of UV/C light for 15 minutes), one printing plate each is used for proof printing on a proof press using a water-based, an alcohol-based and a UV-curable printing ink. The ink transfer, the crispness of the printed image and the uniformity of the print quality over a run time of 3 hours in each case are excellent.

We claim:

1. A process for the production of flexographic printing plates by thermal development, in which the starting material used is a photopolymerizable flexographic printing element which at least comprises, arranged one on top of the other,
   a dimensionally stable substrate,
   at least one photopolymerizable relief-forming layer, at least comprising an elastomeric binder, ethylenically unsaturated monomers and a photoinitiator,
   the process comprising at least the following steps:
   (a) imagewise exposure of the photopolymerizable relief-forming layer by means of actinic radiation,
   (b) heating of the exposed flexographic printing element to a temperature of from 40 to 200° C., (c) removal of the softened, unpolymerized parts of the relief-forming layer with formation of a printing relief, wherein the elastomeric binder is an olefin/(meth)acrylate copolymer having an olefin content of from 50 to 94 mol %, based on the total amount of all monomers incorporated in the form of polymerized units.

2. A process as claimed in claim 1, wherein the imagewise exposure (a) is carried out by placing a mask on the flexographic printing element and effecting exposure through the positioned mask.

3. A process as claimed in claim 1, wherein the flexographic printing element additionally has a digitally imagable layer and step (a) is carried out by writing imagewise on the digitally imagable layer and exposing it through the mask thus prepared.

4. A process as claimed in claim 3, wherein the digitally imagable mask is a mask selected from the group consisting of IR-ablative masks, inkjet masks and thermographic masks.

5. A process as claimed in claim 3, wherein the digitally imagable layer or the residues thereof is or are detached from the relief-forming layer before process step (b).

6. A process as claimed in claim 5, wherein the digitally imagable layer is water-soluble and the digitally imagable layer or the residues thereof is or are detached using water or a predominantly aqueous solvent.

7. A process as claimed in claim 1, wherein the removal of the softened, unpolymerized parts is carried out by bringing the flexographic printing element into contact with an absorbent material.

8. A process as claimed in claim 1, wherein the removal of the softened, unpolymerized parts is carried out by processing the flexographic printing element using hot air or liquid streams under superatmospheric pressure.

9. A process as claimed in claim 1, wherein the temperature is from 60 to 160° C.

10. A process as claimed in claim 1, wherein the olefin content of the elastomeric binder is from 70 to 92 mol %.

11. A process as claimed in claim 1, wherein the olefin content of the elastomeric binder is from 80 to 90 mol %.

12. A process as claimed in claim 1, wherein the elastomeric binder has a melt flow index MFI (190° C., 2.16 kg) of from 1 to 100 g/10 min.

13. A process as claimed in claim 1, wherein the elastomeric binder is an ethylene/(meth)acrylate copolymer.

14. A method of producing a flexographic printing plate which comprises providing a printing element for the production of flexographic printing plates, at least comprising
a dimensionally stable substrate,
at least one photopolymerizable relief-forming layer, at least comprising an elastomeric binder, monomers and a photoinitiator,
wherein the elastomeric binder is an olefin/(meth)acrylate copolymer which contains
from 50 to 94 mol % of olefin monomers,
from 6 to 50 mol % of (meth)acrylate monomers and
from 0 to 5 mol % of further comonomers,
based in each case on the total amount of all monomers incorporated in the form of polymerized units,
imagewise exposing the printing element to actinic light, and
thermally developing the imagewise exposed printing element.

* * * * *